United States Patent
Bozkurt et al.

(10) Patent No.: US 9,940,703 B2
(45) Date of Patent: *Apr. 10, 2018

(54) METHOD OF MEASURING A PROPERTY OF A TARGET STRUCTURE, INSPECTION APPARATUS, LITHOGRAPHIC SYSTEM AND DEVICE MANUFACTURING METHOD

(71) Applicant: ASML Netherlands B.V., Veldhoven (NL)

(72) Inventors: Murat Bozkurt, Veldhoven (NL); Martin Jacobus Johan Jak, 's-Hertogenbosch (NL); Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/473,879

(22) Filed: Mar. 30, 2017

(65) Prior Publication Data

US 2017/0206649 A1  Jul. 20, 2017

Related U.S. Application Data

(63) Continuation of application No. 14/839,325, filed on Aug. 28, 2015, now Pat. No. 9,633,427.

(30) Foreign Application Priority Data

Sep. 1, 2014 (EP) .................................. 14183095

(51) Int. Cl.
*G06K 9/62* (2006.01)
*G06T 7/00* (2017.01)
(Continued)

(52) U.S. Cl.
CPC ............ *G06T 7/0004* (2013.01); *G03F 7/705* (2013.01); *G03F 7/70591* (2013.01);
(Continued)

(58) Field of Classification Search
CPC ............. G03F 7/70633; G03F 7/70625; G03F 7/70666; G03F 7/70608; G03F 7/70683; G03F 9/7076; G06T 2207/30148
See application file for complete search history.

(56) References Cited

U.S. PATENT DOCUMENTS 9,633,427 B2    4/2017  Bozkurt et al.
2005/0012928 A1  1/2005  Sezginer et al.
(Continued)

FOREIGN PATENT DOCUMENTS

WO    WO 2013/178422 A1   12/2013
WO    WO 2014/082938 A1    6/2014

OTHER PUBLICATIONS

International Search Report and Written Opinion of the International Searching Authority directed to related International Patent Application No. PCT/EP2015/069168, dated Jun. 23, 2016; 8 pages.
(Continued)

*Primary Examiner* — Brian Werner
(74) *Attorney, Agent, or Firm* — Sterne, Kessler, Goldstein & Fox P.L.L.C.

(57) ABSTRACT

A property of a target structure is measured based on intensity of an image of the target. The method includes (a) obtaining an image of the target structure; (b) defining a plurality of candidate regions of interest, each candidate region of interest comprising a plurality of pixels in the image; (c) defining an optimization metric value for the candidate regions of interest based at least partly on signal values of pixels within the region of interest; (d) defining a target signal function which defines a contribution of each
(Continued)

pixel in the image to a target signal value. The contribution of each pixel depends on (i) which candidate regions of interest contain that pixel and (ii) optimization metric values of those candidate regions of interest.

18 Claims, 10 Drawing Sheets

(51) Int. Cl.
G03F 7/20 (2006.01)
G06T 7/11 (2017.01)
(52) U.S. Cl.
CPC ............ *G03F 7/70633* (2013.01); *G06T 7/11* (2017.01); *G06T 2207/10061* (2013.01); *G06T 2207/20224* (2013.01); *G06T 2207/30148* (2013.01)

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Boef et al. |
| 2009/0290794 A1 | 11/2009 | Marchesotti |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2012/0242970 A1 | 9/2012 | Smilde et al. |
| 2013/0258310 A1 | 10/2013 | Smilde et al. |
| 2013/0271740 A1 | 10/2013 | Quintanilha |
| 2014/0136137 A1 | 5/2014 | Tarshish-Shapir et al. |
| 2014/0139814 A1 | 5/2014 | Cramer et al. |
| 2014/0334735 A1 | 11/2014 | Pitts et al. |
| 2015/0138523 A1 | 5/2015 | Jak et al. |
| 2016/0086324 A1 | 3/2016 | Bozkurt et al. |

OTHER PUBLICATIONS

"Central tendency," Wikipedia—the free encyclopedia, accessed at http://en.wikipedia.org/wiki/Central_tendency on Aug. 26, 2014; 4 pages.

"Statistical dispersion," Wikipedia—the free encyclopedia, accessed at http://en.wikipedia.org/wiki/Statistical_dispersion on Aug. 26, 2014; 3 pages.

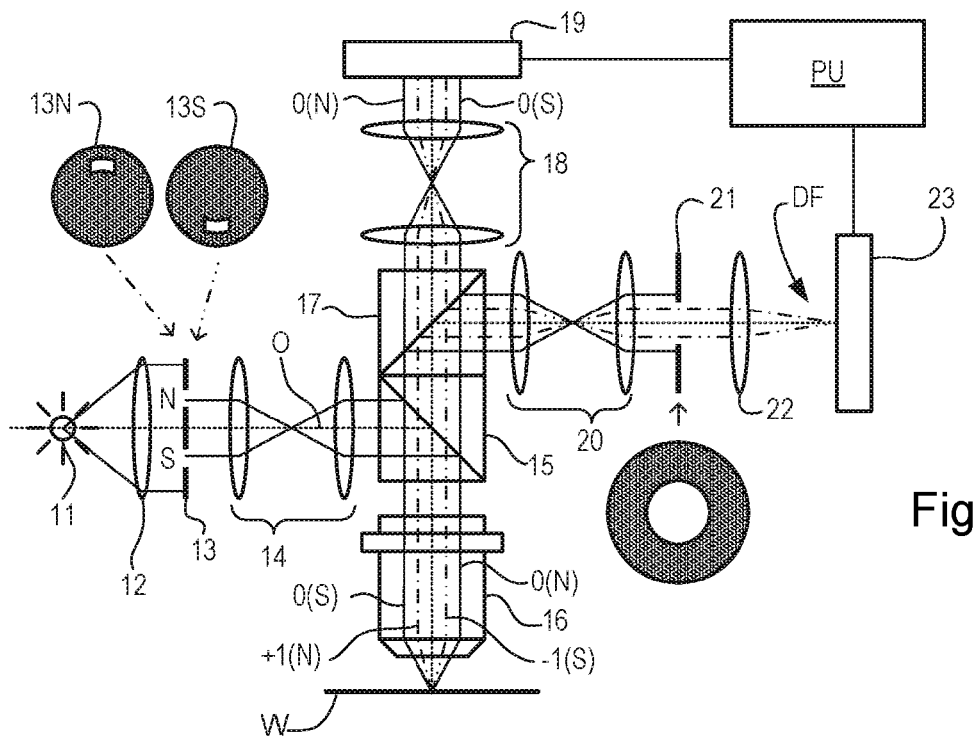
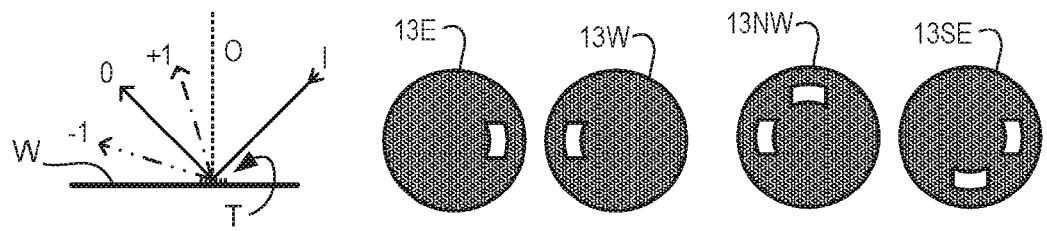
Fig. 3(a)  Fig. 3(b)  Fig. 3(c)  Fig. 3(d)
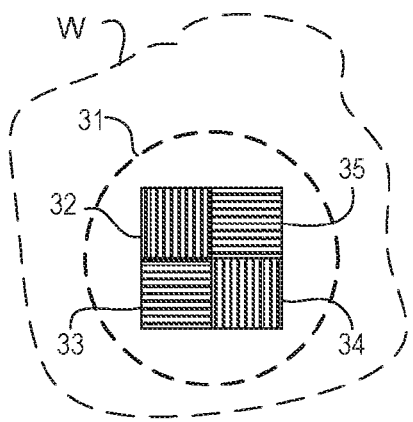
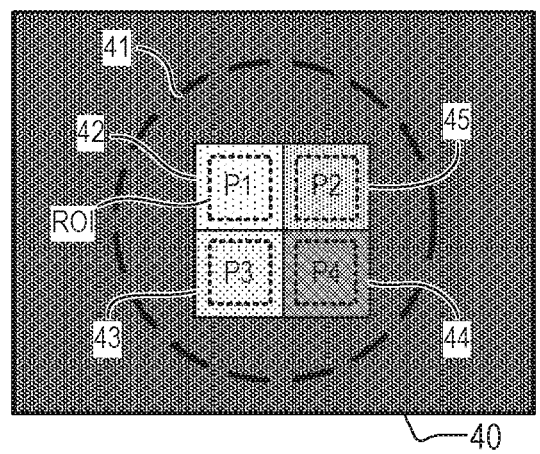
Fig. 4 (PRIOR ART)  Fig. 5 (PRIOR ART)

METHOD OF MEASURING A PROPERTY OF A TARGET STRUCTURE, INSPECTION APPARATUS, LITHOGRAPHIC SYSTEM AND DEVICE MANUFACTURING METHOD

CROSS REFERENCE TO RELATED APPLICATIONS

This application is a continuation of U.S. patent application Ser. No. 14/839,325, filed Aug. 28, 2015 (now U.S. Pat. No. 9,633,427), which claims the benefit of EP Application No. 14183095.0, filed Sep. 1, 2014, both of which are incorporated by reference herein in their entireties.

BACKGROUND

Field of the Invention

The present invention relates to methods and inspection apparatuses usable, for example, to perform metrology in the manufacture of devices by lithographic techniques. The invention further relates to computer program products for use in such inspection apparatus and to lithographic systems and methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm gratings, and the measurement beam generates a spot that is smaller than the grating (i.e., the grating is underfilled). In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error. In addition to overlay, other performance parameters of the lithographic process can be measured using targets of the same general form and by the same general procedure as illustrated in FIG. 4. In particular, targets can be designed in which asymmetry of the target depends, for example, on focus error in the lithographic process, or on exposure dose errors.

Because of the reduced size of the individual gratings in a composite grating target, edge effects (fringes) in the dark-field image become significant, and there can be crosstalk between the images of different gratings within the target. To address this issue, US20110027704A mentioned above teaches to select only a central portion of the image of each grating as a 'region of interest' (ROI). Only pixel values within the ROI are used to calculate asymmetry and overlay.

As one considers ever smaller targets, however, the size of ROI that can be defined to be free of edge effects reduces to ever smaller numbers of pixels. Consequently the measurements are inherently more noisy, for a given acquisition time. Moreover, any variation in positioning the ROI becomes a significant source of error in the measured asymmetry.

Edge effects can be very intense. Asymmetric edges of the grating will increase the intensity signal error if they are large and intense enough to end up inside the ROI. For small pattern recognition errors in placement of the ROI, only a small part of the high intensity edge might end up inside the ROI. The small presence of edge effects is not a problem because a conventional 1σ or 2σ-filter is successful in removing these pixels. However, for larger pattern recognition errors, the 2σ-filter will work less well and larger errors in the intensity signal will be introduced.

Oscillations in intensity can occur inside the ROI as a result of the Gibbs phenomenon. This may happen for example when a pupil filter of 0.4 NA (numerical aperture) is used in the scatterometer and a limited number of Fourier components are available to form the grating field image. This results in periodic oscillations of the intensity across the grating image. Because of this effect, a slightly different placement of the ROI on top of the periodic oscillations will result in different average intensities across the ROI. The final averaged intensity is thus very sensitive to the placement of the ROI.

Intensity gradients across the grating image may be caused by the effects of defocus in combination with high NA detection. The final effect is that the ROI has to be placed on a slope in intensity. In this case an error in positioning will result in extra errors in average intensity. It may be expected that these intensity gradients will be more severe in future generations of apparatus, where off-axis illumination and off-axis collection of scattered radiation make the signals more sensitive to focusing errors. Also in the case of focusing errors, images of component gratings within a compound target may move in different directions so as to overlay with one another. Existing signal extraction methods will be increasingly challenged.

SUMMARY OF THE INVENTION

The inventors have recognized that dark-field intensity measurements of overlay targets can be improved. The present invention aim to provide a method of measuring a property of a target structure that addresses one or more of the problems with known techniques, identified above.

The invention in a first aspect provides a method of measuring a property of a target structure on a substrate, the method comprising the steps of:

(a) obtaining an image of the target structure using a predetermined portion of radiation diffracted by the target structure under illumination;

(b) defining a plurality of candidate regions of interest, each candidate region of interest comprising a plurality of pixels in said image;

(c) defining an optimization metric value for the candidate regions of interest based at least partly on signal values of pixels within the region of interest;

(d) defining directly or indirectly a target signal function which defines a contribution of each pixel in the image to a target signal value, the contribution of each pixel depending on (i) which candidate regions of interest contain that pixel and (ii) optimization metric values of those candidate regions of interest; and (e) obtaining a measurement of the property of the same target structure or a different target structure using a target signal value calculated directly or indirectly by combining multiple pixel signal values from a detected image in accordance with the defined target signal function.

The invention in a second aspect provides an inspection apparatus for measuring a property of a target structure on a substrate, the apparatus comprising:

a support for the substrate having said target structure formed thereon;

an optical system for illuminating the target structure and obtaining an image of the target structure using a predetermined portion of radiation diffracted by the target structure;

a processor arranged to:

define a plurality of candidate regions of interest, each candidate region of interest comprising a plurality of pixels in said image;

define an optimization metric value for the candidate regions of interest based at least partly on signal values of pixels within the region of interest;

define directly or indirectly a target signal function which defines a contribution of each pixel in the image to a target signal value, the contribution of each pixel depending on (i) which candidate regions of interest contain that pixel and (ii) optimization metric values of those candidate regions of interest; and obtain a measurement of the property of the same target structure or a different target structure using a target signal value calculated directly or indirectly by combining multiple pixel signal values from a detected image in accordance with the defined target signal function.

The invention in a third aspect provides a computer program product comprising machine-readable instructions for causing a general purpose processing apparatus to perform the steps (b) to (e) of a method according to the first aspect.

The invention in a fourth aspect provides a lithographic system comprising:

a lithographic apparatus comprising:

an illumination optical system arranged to illuminate a pattern;

a projection optical system arranged to project an image of the pattern onto a substrate; and an inspection apparatus according to the second aspect, wherein the lithographic apparatus is arranged to use the measurement results from the inspection apparatus in applying the pattern to further substrates.

The invention in a fifth aspect provides a method of manufacturing devices wherein a device pattern is applied to a series of substrates using a lithographic process, the method including inspecting at least one target structure formed as part of or beside said device pattern on at least one of said substrates using a method according to the first aspect and controlling the lithographic process for later substrates in accordance with the result of the method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3A-3D comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction-based overlay measurements and (d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

DETAILED DESCRIPTION OF EXEMPLARY EMBODIMENTS

Before describing embodiments of the invention in detail, it is instructive to present an example environment in which embodiments of the present invention may be implemented.

Figure 1:
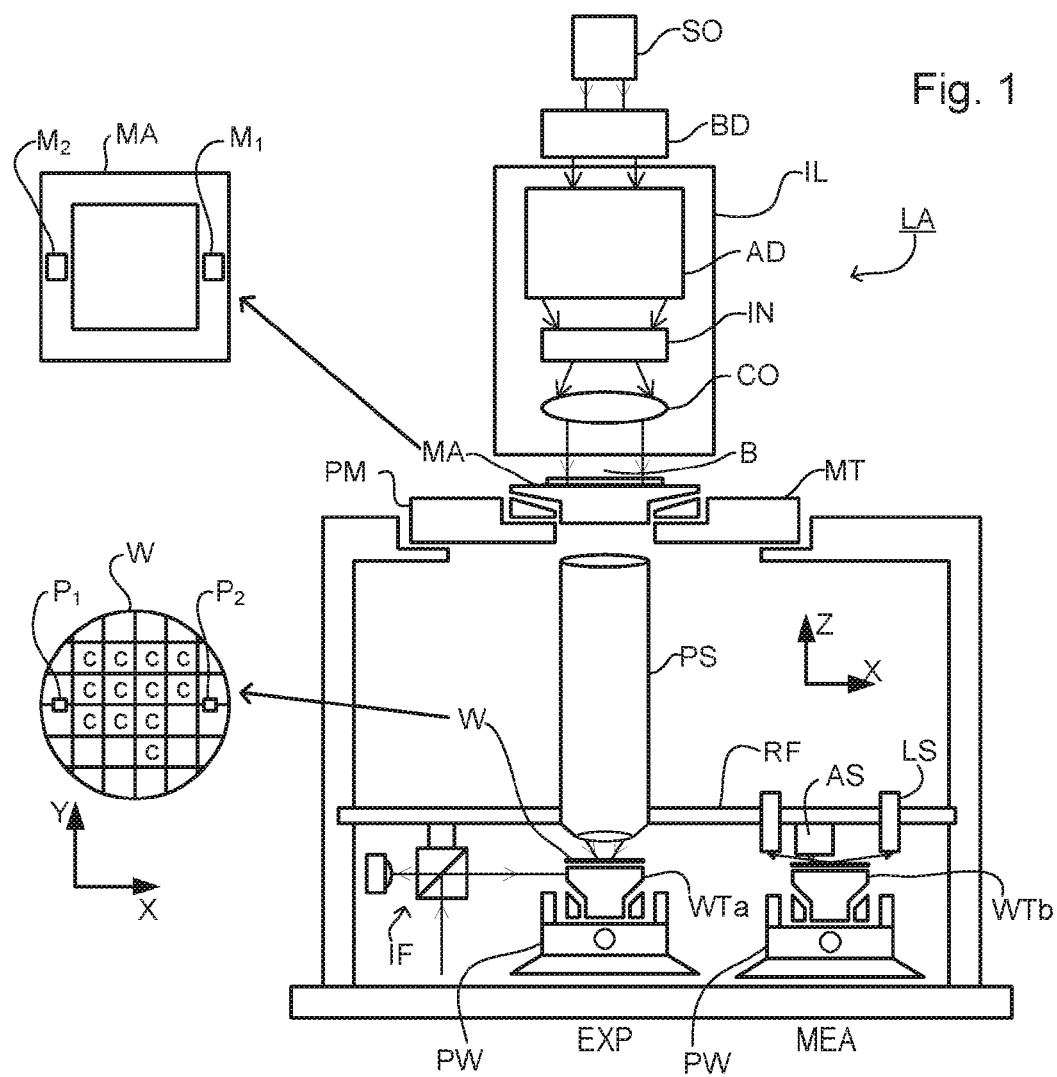
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms, The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
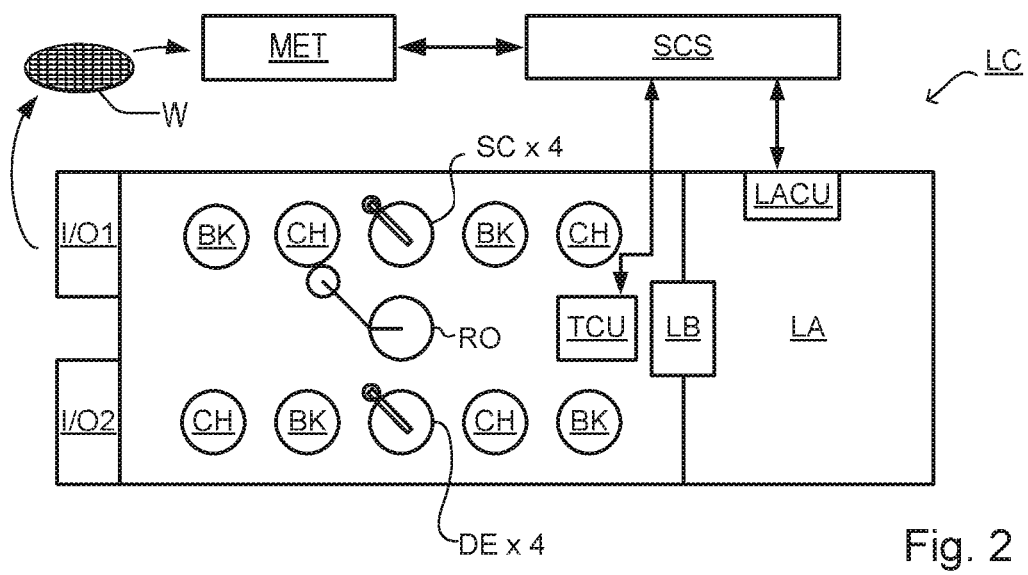
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A dark field metrology apparatus suitable for use in embodiments of the invention is shown in FIG. 3(a). A grating target T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), grating target T is placed with substrate W normal to the optical axis O of objective lens 16. A ray of illumination I impinging on target T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target T and other features. Where a composite grating target is provided, each individual grating within the target will give rise to its own diffraction spectrum. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used, and an aperture stop with an off-axis aperture is used to pass substantially only one first order of diffracted light to the sensor. (The apertures shown at 13 and 21 are effectively swapped in that case.) In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

Overlay Measurement Using Small Targets

FIG. 4 depicts a composite grating target formed on a substrate according to known practice. The composite target comprises four individual gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The cross-hatched rectangle 40 represents the field of the image on the sensor, within which the illuminated spot 31 on the substrate is imaged into a corresponding circular area 41. Ideally the field is dark. Within this dark field image, rectangular areas 42-45 represent the images of the individual gratings 32 to 35. If the gratings are located in product areas, product features may also be visible in the periphery of this image field. While only a single composite grating target is shown in the dark field image of FIG. 5, in practice a semiconductor device or other product made by lithography may have many layers, and overlay measurements are desired to be made between different pairs of layers. For each overlay measurement between pair of layers, one or more composite grating targets are required, and therefore other composite grating targets may be present, within the image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
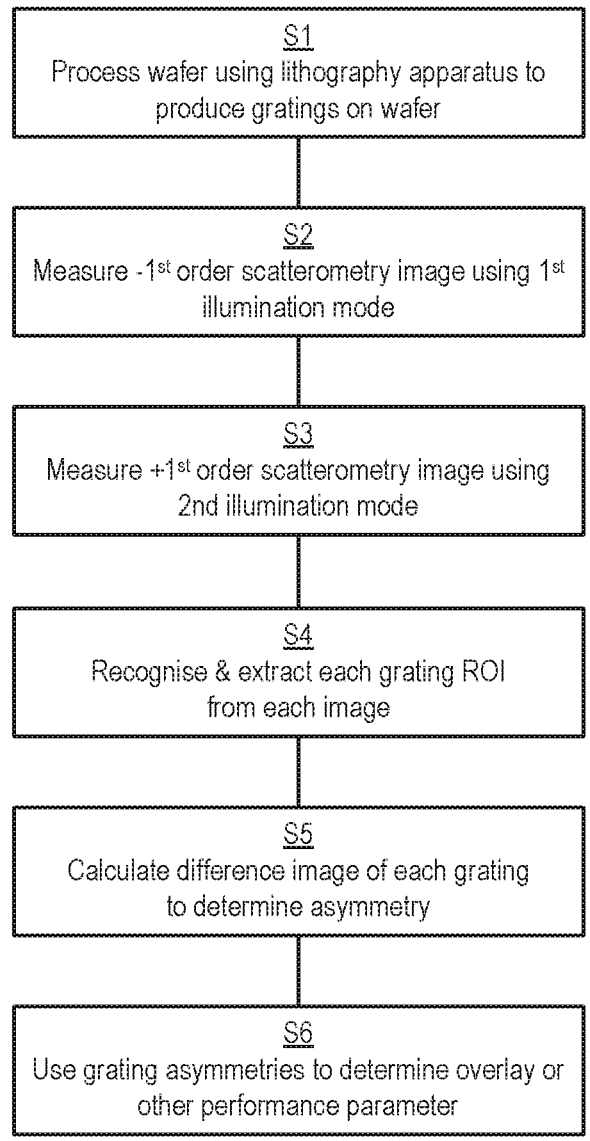
FIG. 6 is a flowchart showing the steps of a known overlay measurement method using the scatterometer of FIG. 3.

FIG. 6 illustrates how, using for example the method described in application US20110027704A, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. Each grating will be represented simply by an area of a certain intensity level. The individual grating lines will not be resolved, because only one of the +1 and −1 order diffracted radiation is present. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

In the prior applications, mentioned above, various techniques are disclosed for improving the quality of overlay measurements using the basic method mentioned above. For example, the intensity differences between images may be attributable to differences in the optical paths used for the different measurements, and not purely asymmetry in the target. The illumination source 11 may be such that the intensity and/or phase of illumination spot 31 is not uniform. Corrections can be determined and applied to minimize such errors, by reference for example to the position of the target image in the image field of sensor 23. The individual component gratings may be elongated in their direction of periodicity, so as to maximize the useful diffraction signals within a given target area. These techniques are explained in the prior applications, and will not be explained here in further detail. They may be used in combination with the techniques newly disclosed in the present application, which will now be described.

In US20130271740A, features in and around edge portions of the individual gratings are modified so as to reduce the intensity and extent of edge effects. These modifications may work in a similar way to optical proximity correction (OPC) features used to enhance the printing of fine features in a lithographic process. In US20130258310A, it is proposed to use three or more component gratings to measure overlay by the method of FIG. 6. By measuring asymmetries for gratings with at least three different biases, the calculations in step S6 can be modified so as to correct for feature asymmetry in the target gratings, such as is caused by bottom grating asymmetry in a practical lithographic process. These techniques similarly are explained in the prior applications, and will not be explained here in further detail. They may be used in combination with the techniques newly disclosed in the present application, which will now be described.

In addition to overlay, other performance parameters of the lithographic process can be measured using targets of the same general form and by the same general procedure as illustrated above. In particular, targets can be designed in which asymmetry of the target depends, for example, on focus error in the lithographic process, or on exposure dose errors. The above apparatus and techniques are therefore adaptable to diffraction-based focus measurement and diffraction-based dose measurement, as well as diffraction-based overlay. Overlay is used in this disclosure only as one example of a performance parameter that can be measured by the techniques disclosed. Similar considerations over small target sizes, bias schemes and the like will apply equally in the measurement of these other parameters.

Before embodiments of the present invention are described, the known procedure for measuring intensity on a dark-field overlay target will be described with reference to FIG. 7.

Figure 7:
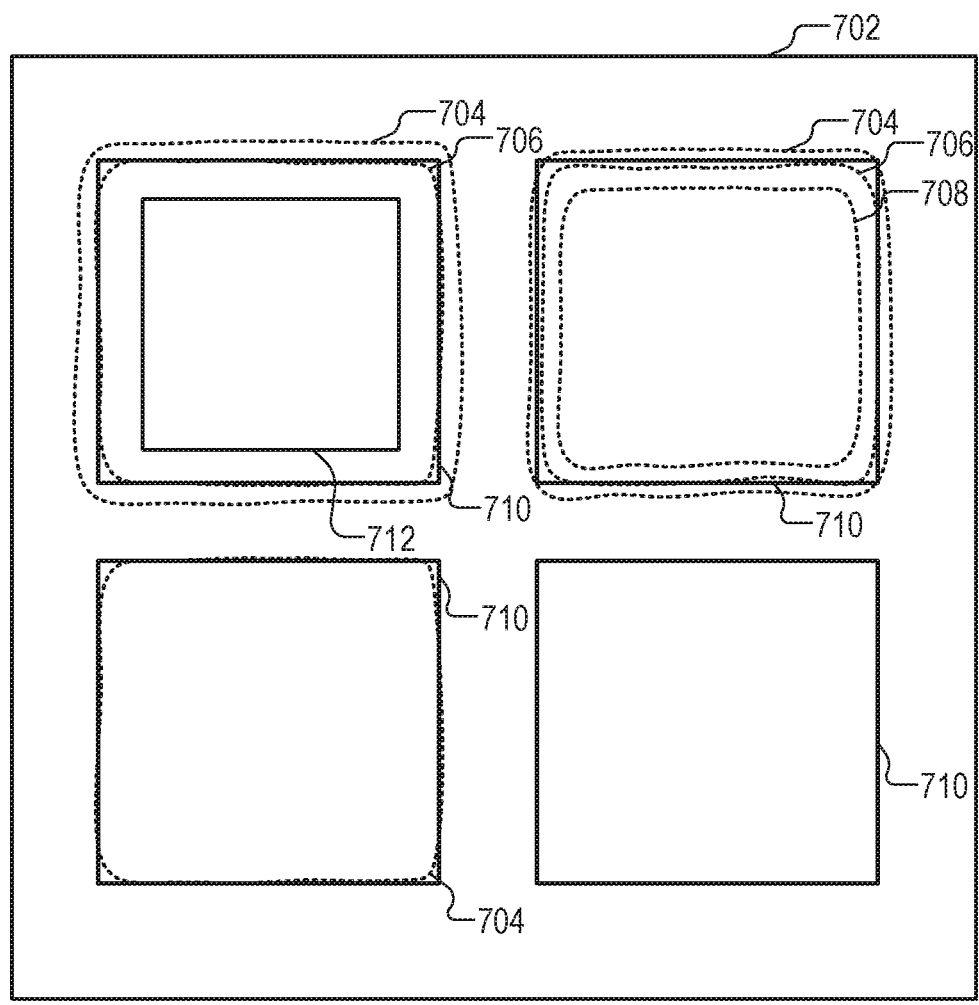
FIG. 7 illustrates an image of a dark-field overlay target and the positioning of the region of interest (ROI) in one of the target's gratings, in accordance with the conventional metrology technique.

FIG. 7 illustrates a typical image of a dark-field overlay target and the positioning of an ROI box in one of the target's gratings, in accordance with the known metrology technique. The dark-field image obtained from the image sensor 23 is shown a large square 702, although it may be rectangular or any shape. Dotted lines 704 to 708 represent intensity contours, with intensity increasing from 704, through 706 to 708.

Pattern recognition algorithms are used to recognize the target gratings and to determine the position of the ROI. The four gratings are recognized, as depicted by the four squares 710. In this example an ROI box 712 is simply square. The accuracy and precision of this technique might go up to several hundreds of nanometers. Individual ROI boxes are placed on top of each individual grating, taking into account possible edge effects. The location of the ROI boxes depends on the target shape and the size of each ROI box is fixed.

Inside each ROI, bounded by an ROI box, a statistical filter such as for example a 2σ-filter is applied to remove outlying pixels values and the average intensity is calculated for each ROI with the remaining pixels.

Figure 8:
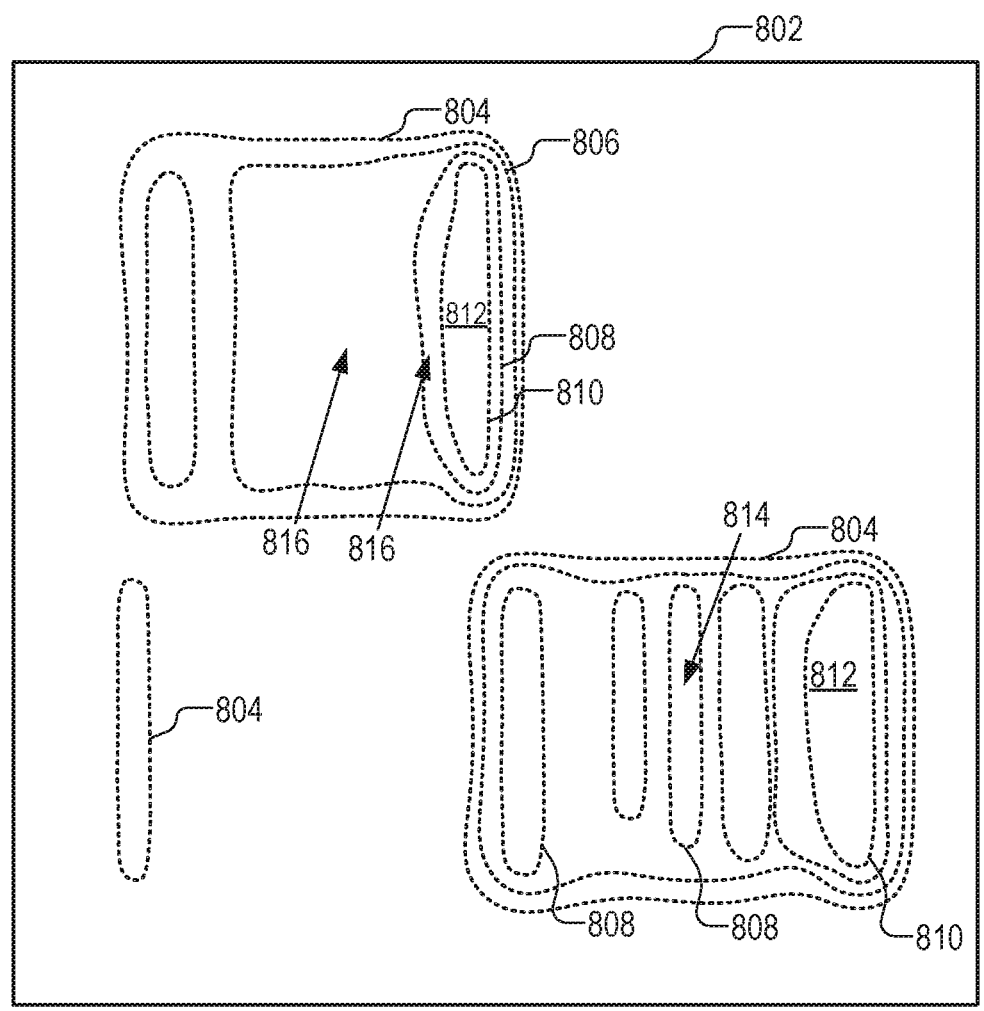
FIG. 8 illustrates a dark-field image suffering from edge effects and intensity oscillations and gradients.

As discussed above in the Background Art section, there are problems with edge effects, oscillations in intensity and gradients in intensity. FIG. 8 illustrates a dark-field image suffering heavily from these effects. The dark-field image obtained from the image sensor 23 is shown as a large square 802, although it may be rectangular or any shape. Dotted lines 804 to 810 represent intensity contours, with intensity increasing from 804, through to 810. A strong edge effect is visible at the right hand sides 812 of the two gratings. An oscillation in intensity 814 is apparent in the lower right grating. An intensity gradient 816 is apparent in the upper left grating.

The following embodiments within the present disclosure provide methods of measuring intensity that address these problems. Consequently, more accurate measurements of asymmetry and performance parameters such as overlay, focus or dose can be obtained.

The original dark-field image undergoes a transformation before being analyzed to extract intensity levels. During the transformation, many combinations of ROI size and position are taken into account. ROI boxes with bad results are removed and only ROI boxes with stable results are taken into account.

Figure 9:
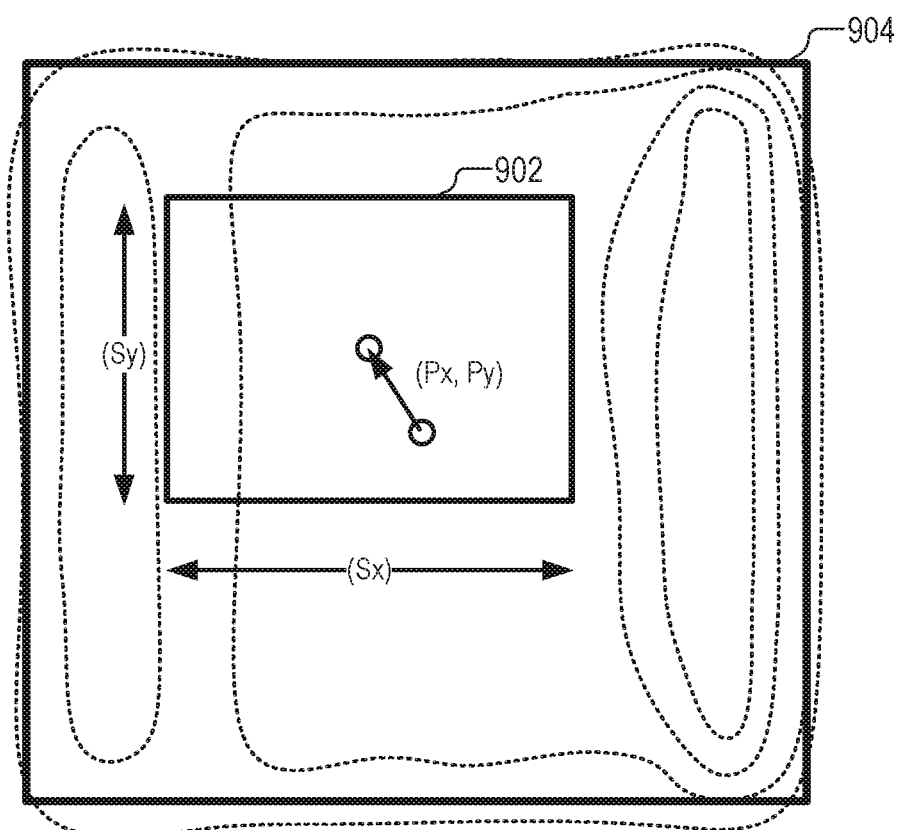
FIG. 9 illustrates ROI placement according to an embodiment of the present invention.

FIG. 9 illustrates the definition of candidate ROIs according to a first example of the present disclosure. The illustration shows the dark field image of a single component, grating, it being understood that the same procedure will be applied to numerous individual images. As in FIG. 8, the dotted lines represent intensity contours within the dark-field image. Instead of using a single-sized and positioned ROI box, as shown at 712 in FIG. 7, a set of different sizes and different positions of ROI box 902 are considered as candidates. Multiple candidates are taken into account in the final calculations.

As illustrated in FIG. 9, the process of signal extraction starts with the definition of a number of smaller candidate ROI boxes inside a "hard boundary" 904. Pattern recognition is used to find the hard boundary so that it is roughly coincident with the grating image, for example the boxes labeled 710 in FIG. 7 may serve as the hard boundaries. Each candidate ROI box 902 has dimensions Sx, Sy and position Px, Py relative to the position of the hard boundary

904. The dimensions and position are chosen such that the ROI box 902 does not cross the hard boundary 904. For each candidate ROI box with a size Sx, Sy, and position Px, Px, one or more representative signal values may be calculated using a measure of central tendency, such as a mean. For each candidate ROI box, an optimization metric value based on pixel signal values within the candidate ROI box is calculated. In this particular embodiment, the average intensity I is calculated as a representative signal value and a standard deviation α is calculated as an optimization metric value:

$$I(Sx,Sy,Px,Py)$$

$$3\sigma I(Sx,Sy,Px,Py)$$

The standard deviation σ or other variation measure can be a normalized, relative value, rather than a 'raw' standard deviation of values in the ROI box. Bearing in mind that different candidate ROI boxes will hold different numbers of pixels, a so-called relative standard deviation can be obtained for example by scaling the simple standard deviation by a factor $N^{-1/2}$, where N is the number of pixels in the candidate ROI. A normalized standard deviation, expressed for example as a percentage, can be calculated by dividing each σ by the average of pixel values in the candidate ROI, and multiplying by 100. For each individual ROI box, a filter can be applied prior to calculating either or both of the above parameters, to remove outlying values from the data. Different filters can be used in combination. In one example a 1σ-filter is used for ROI boxes approaching the hard boundary, and a 2σ-filter otherwise. After filtering, the standard deviation is recalculated for each ROI for use in further calculations.

The representative signal values of the candidate ROI boxes, over all variations of size and position form a multidimensional data set. Each candidate ROI box can be regarded as a data point within a multidimensional space. In the above example, a four-dimensional data set is formed by the representative signal values I(Sx, Sy, Px, Py). This data set is then processed to determine the contribution each pixel will make in an optimized signal value representing the grating image as a whole. In one example, the values I(Sx, Sy, Px, Py) are combined in such a way that the corresponding variation measure 3σI is used as a selecting criterion and/or as a weighting factor. In one example, points with large 3σI are disregarded, and the remaining data points are averaged with corresponding ⅓σI's as a weighting factor.

Figure 10A:
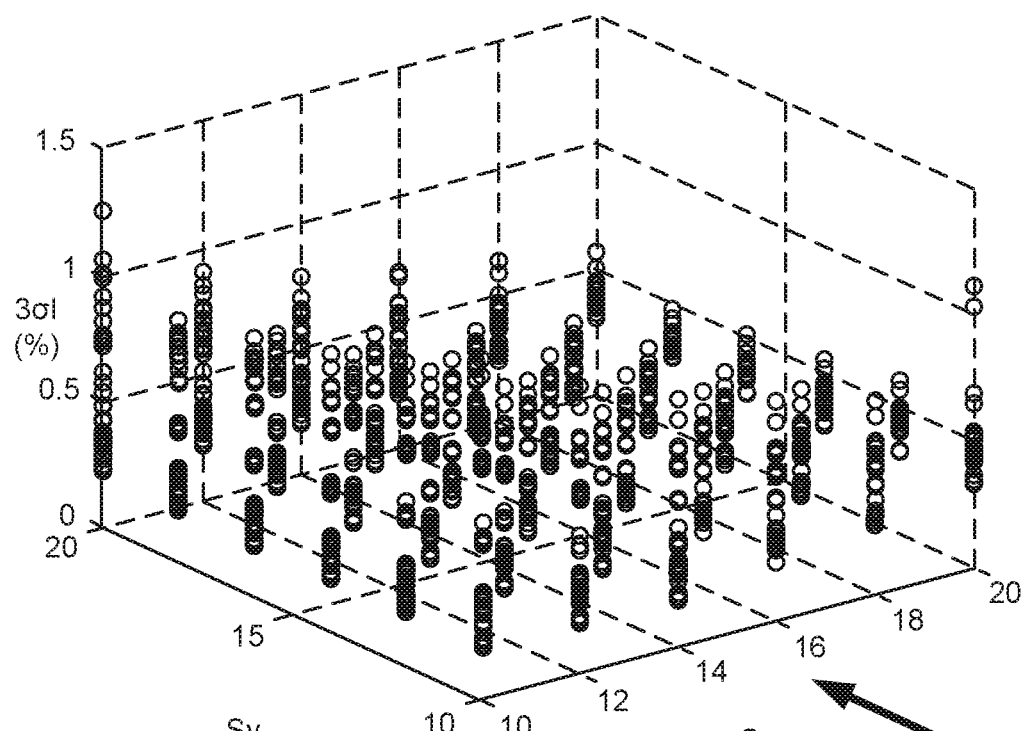
FIGS. 10A and 10B shows graphs showing in 3-D the distribution of an example optimization metric 3σI (in %) for different combinations of Sx (X-axis), Sy (Y-axis), Px and Py.
Figure 10B:
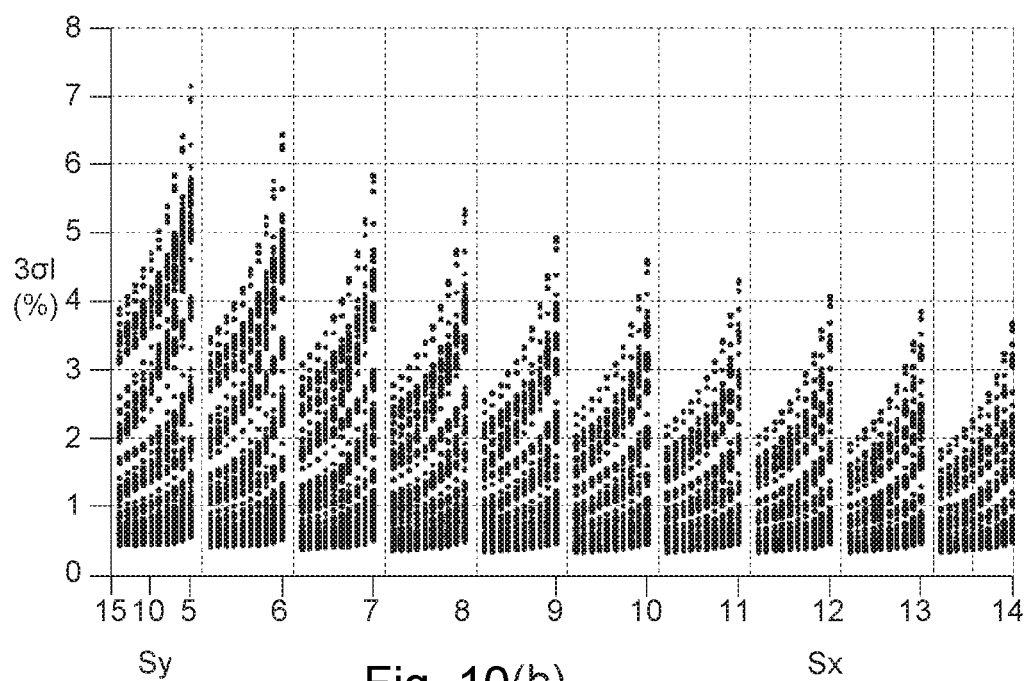

An example set of data points is shown in FIG. 10 (*a*), where the measure of variation 3σI has been plotted in a 3-D graph as a function of Sx and Sy. Thus FIG. 10 (*a*) shows the 3-D distribution of 3σI (vertical axis; in %) for different combinations of Sx (X-axis), Sy (Y-axis). At each location in the plot Sx, Sy, a column of dots represents the individual ROI boxes with different positions, Px and Py. FIG. 10 (*b*) shows the same type of data set plotted on two axes, with a view being taken along the direction of the large arrow in FIG. 10(*a*). A limit, for example at 3σI≥1% can be set, below which all points are taken into account. Points above 1% can be disregarded. During averaging ⅓σI is used as a weighting factor. The multidimensional data set represented in FIGS. 10 (*a*) and (*b*) can be considered as a transformed version of the original image. Instead of extracting the signal from the original image, an analysis related to the data set shown in the plots of FIG. 10 give better results.

Tests with the method disclosed herein show that it is relatively insensitive to large errors with pattern recognition. A comparison between optimum conventional scatterometer software settings and an embodiment of the method disclosed herein showed that similar overlay precision numbers were obtained, even in the case of relatively large pattern recognition errors (1-2 μm). This offers the possibility to omit pattern recognition if the target positioning inside the illumination spot is accurate enough up to few microns.

Figure 11:
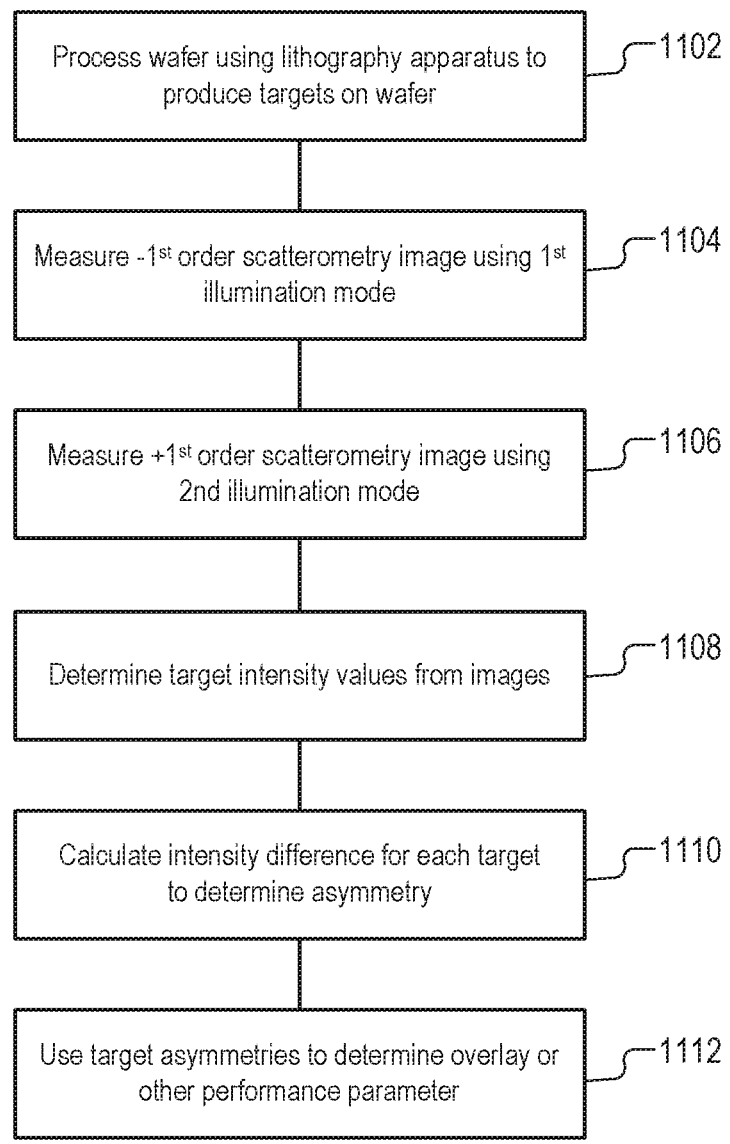
FIG. 11 is a flowchart showing the steps of an overlay measurement method using the scatterometer of FIG. 3 in accordance with an embodiment of the present invention.

FIG. 11 is a flowchart showing the steps of an overlay measurement method using the scatterometer of FIG. 3 in accordance with an embodiment of the present invention. The flowchart has steps 1102 to 1106 and 1112 in common with the known method as described with reference to FIG. 6, but in relation to targets in general rather than gratings. Steps 1102 to 1106 correspond to the steps of forming and detecting an image of a target structure using a predetermined portion of radiation diffracted by the target structure under predetermined illumination conditions. Step 1112 of using target asymmetries to determine overlay or another performance parameter corresponds to measuring a property of a target structure.

Steps 1108 and 1110 are different from FIG. 6.

In step 1108, target intensity values are determined from the images measured in steps 1104 and 1106. An example procedure for determining the target intensity value is disclosed below with reference to FIG. 12.

In step 1110, the intensity difference for each target is calculated to determine asymmetry of the target. Thus the property of asymmetry or overlay error of the target structure has been measured.

Figure 12:
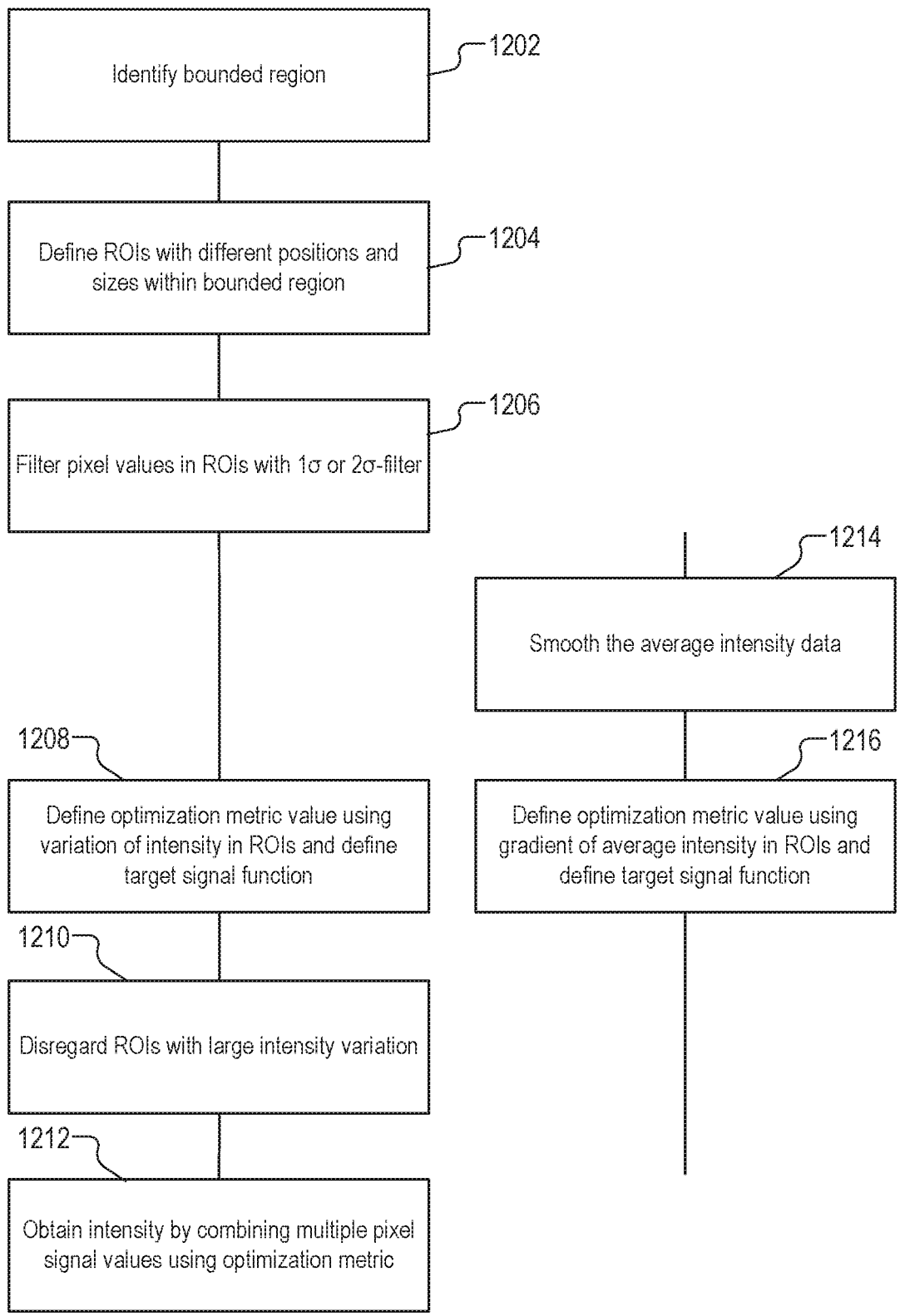
FIG. 12 is a flowchart showing the steps of determining a target intensity value in accordance with embodiments of the present invention.

FIG. 12 is a flowchart showing the steps of determining a target intensity value in accordance with embodiments of the present invention.

In step 1202, which is optional, a bounded region is identified in the detected image.

The bounded region corresponds to a specific target structure.

In step 1204, a plurality of candidate regions of interest (ROIs) are defined. Each ROI has a plurality of pixels in the image or bounded region. The ROIs may differ from one another in two or more parameters defining which pixels of the image are contained within each ROI. In this example, the parameters (Sx, Sy, Px, Py) define the size and position of each ROI in the image or bounded region. With square pixels, the ROI may be square or rectangular. However, pixels and regions of interest are not limited to such shapes. For example, pixels may be rectangular or hexagonal and ROIs may have arbitrary shape and may not be contiguous.

The same size and shape of ROI may be used multiple times but with each being associated with a different estimator. For example one ROI may have a 1σ-filter threshold and another a 2σ-filter threshold. The choice of filter becomes another parameter of the multi-dimensional set of data points. If the filter excludes certain pixels from being counted in the estimator, then pixels outside the 1σ or 2σ threshold are effectively excluded from the ROI.

At least some of the regions of interest overlap each other so that a given pixel may be contained within more than one of the candidate ROIs.

In step 1206, pixel signal values of pixels contained within ROIs are filtered, for example using 1σ-filter or a 2σ-filter, depending on the proximity of the ROI to the edge of the image or bounded region.

In an embodiment, at step 1208, an optimization metric value is defined for each of the ROIs based at least partly on signal values of pixels within the ROI. The optimization metric value in this example, 1/σI(Sx, Sy, Px, Py), is based on the standard deviation σI(Sx, Sy, Px, Py) of pixel signal values of pixels contained within the respective ROI. As discussed above, other measures of statistical dispersion than standard deviation may be used. A target signal function is defined directly or indirectly which defines a contribution of each pixel in the image to a target signal value, the contribution of each pixel depending on (i) which candidate ROIs contain that pixel and (ii) optimization metric values of those candidate ROIs.

In step 1210, optimization metric values are disregarded based on a measure of statistical dispersion, in this example standard deviation, $\sigma I(S_x, S_y, P_x, P_y)$, of pixel signal values of pixels contained within the respective ROI. Thus points with a large $3\sigma I$ may be removed from the dataset, or disregarded in further calculations, or given zero weight.

In step 1212, a target signal value, such as intensity, is determined by combining pixel signal values from the detected image. This is done using the optimization metric values to determine a contribution of a given pixel to the target signal value. Thus a target signal value is defined as a function of signal values of pixels in the image, the contribution of each pixel to the target signal value depending on (i) which candidate regions of interest contain that pixel and (ii) optimization metric values of those candidate regions of interest. A measurement of the property of the same target structure or a different target structure may be obtained by determining a target signal value by combining multiple pixel signal values from a detected image in accordance with the defined contributions. The manner in which each pixel's signal value contributes to a target signal value (a signal values for the target as a whole) can be regarded as a target signal function. The target signal function may be defined directly (explicitly) as part of the process, or it may be defined only indirectly, depending on the embodiment.

In an embodiment, the contribution of each pixel is determined indirectly, by using the optimization metric values to define a weight for a representative signal value for each ROI, and using a weighted combination of the representative signal values for the different ROIs to calculate a target signal value. The representative signal value may be for example an average or mean of pixel intensity in the ROI, labeled $I(S_x, S_y, P_x, P_y)$ in the examples above. The mean is a measure of central tendency of pixel signal values of pixels contained within ROIs. Other measures of central tendency, as discussed above, may be used. Thus, compared to the known technique, pixels are not combined directly, but instead representative values of the transformed data set are used in combination. In the 4D space, representation of which is shown by the graphs of FIGS. 10 (*a*) and 10 (*b*), each point is the intensity or standard deviation obtained by analyzing multiple pixels in each respective ROI.

The pixel signal values of pixels contained within the respective ROI may be filtered before determining the contribution of a given pixel to the target signal value. This may be done using a $1\sigma$-filter and $2\sigma$-filter.

In another embodiment, the contribution of each pixel (in other words, the target signal function) is determined directly and optimization metric values for the candidate ROIs are used in combination to define a weighting value for each pixel to the target signal value by defining a weighting for each pixel signal values from a detected image. Thus the optimization metric values may be used to produce a "contribution map", of weightings that define contributions of individual pixels in the final target signal value. The end result may be the same as in the previous embodiment. However, when the target signal function is defined as a contribution map, it may be stored and used in the same or other grating images, without recalculating and applying the optimization metric values. The contribution of each pixel can be represented by a pixel weighting value which is a combination of weighting values of all the candidate regions of interest in which that pixel is contained. The weighting values of the candidate regions of interest are defined by reference to their optimization metric values, just as in the example above. However, in the present embodiment, the calculation of the target signal value is not performed directly, but rather the contribution map is calculated first.

This contribution map (representing directly the target signal function) may thus be used to take the optimization from one target structure and to apply it to pixel values from another part of the image, corresponding to another target structure. The contribution map may be applied to other images of similar structures on the same or on different substrates. This saves performing the optimization calculations and is appropriate when the similar targets have processing in common, such that the optimization derived from one target is relevant to the subsequent targets. In this case, pattern recognition is used to locate the other targets which are subject to the use of the contribution map. The pixel signal values from the detected image may be filtered before determining the contribution of a given pixel to the target signal value. Again, this may be done using a $1\sigma$-filter and $2\sigma$-filter.

The optimization metric value may be calculated using a characteristic of apparatus used to form and detect the image.

In another embodiment, instead of steps 1208 and 1210, steps 1214 and 1216 are performed.

In step 1214, the mean pixel value data, $I(S_x, S_y, P_x, P_y)$, and/or the size and position data, $(S_x, S_y, P_x, P_y)$ are smoothed before determining the optimization metric value.

In step 1216, the optimization metric value for each of the ROIs is defined based at least partly on signal values of pixels in the ROI, like step 1208. However in this example, the optimization metric value is based on a rate of change (in this example 1/gradient) of a representative signal value relative to one or more of the parameters (e.g. position or size) in a multi-dimensional space containing the set of candidate ROIs. In this example, the representative signal value is $I(S_x, S_y, P_x, P_y)$, determined from pixel signal values of pixels contained within ROIs. A target signal function is defined directly or indirectly which defines a contribution of each pixel in the image to a target signal value, the contribution of each pixel depending on (i) which candidate ROIs contain that pixel and (ii) optimization metric values of those candidate ROIs.

Multiple different embodiments of this method can be employed. The common characteristic is that, on the fly, the optimum position and/or size of the ROI is determined depending on the image characteristics. An example embodiment uses a single ROI box out of the many combinations for each of the four gratings. However, the size, shape and position of the ROI box can be optimized for each of the four gratings separately. This can be done each time on a target, or it can be done only once and the results can be used for all other targets.

The choice and number of variable parameters of the set of candidate ROI boxes is a matter of design choice. In a first embodiment only the position of the ROI is varied to generate the data set comprising the representative signal values used for producing an optimized metric value. The multidimensional data set may be subjected to a smoothing function in some or all dimensions, to reduce the effects of random variations between candidate ROI boxes. References to representative signal values and optimized metric values of the candidate ROI box should be understood as referring to the smoothed value in that case, and not necessarily only the values obtained from the candidate ROI in isolation from all others. A suitable smoothing function may be a polynomial function in the same number of dimensions as the data set. For example, a filtered version of the multidimensional data set I(Sx, Sy, Px, Py) can be defined by a polynomial function of the parameters Sx, Sy, Px, Py. This polynomial function can be fitted to the data set by a well-known technique such as a least squares fit and then used in place of the data set. In a second embodiment only the size of the ROI is varied. In a third embodiment both size and position are optimized simultaneously (as described above). Size may be varied in two dimensions, as described above, or in one dimension only (for example by constraining the ROI box shape to be a square, or a circle).

In the above embodiments, several candidate ROI boxes may be used in a weighted average combination, to determine what contribution each pixel value makes in the overall result. In another embodiment, a single 'best' candidate ROI box may be selected and used.

The optimization calculations described above may be performed automatically for every grating image in every image of a compound target. Alternatively, the full optimization calculations may be performed only for selected targets, and the resulting map of contributions of individual pixels may be stored and re-used in other grating images. Thus, in another embodiment, the optimization is done common for all ROIs in the image of the compound target, but separate for each individual image, while in yet another embodiment the optimization is done for each ROI separately. In an embodiment where X and Y direction gratings are expected to move in different directions in the captured images, due to aberrations when images are no perfectly focused, the contributions may be calculated once for the X images, and once for the Y images.

During the optimization process the contribution is optimized with respect to an optimization metric parameter. As described above this parameter can be a minimization of the 3σ variation within the ROI area. In more general statistical terms, the parameter may be a measure of statistical dispersion, which includes a variety of possibilities. A measure of statistical dispersion is zero if all the data are the same and increases as the data become more diverse. Measures of statistical dispersion include interquartile range (IQR) or interdecile range, range, mean difference, median absolute deviation (MAD), average absolute deviation (or simply called average deviation), coefficient of variation, quartile coefficient of dispersion, relative mean difference and variance.

Therefore different parameters can be used, such as range (maximum value minus minimum value), or the difference between the 75% percentile and 25% percentile values. Rather than using a measure of variation from within the pixel values in a candidate ROI box (e.g. σ as described above), a measure of variation can be derived by comparing the representative signal values across the dimensions of the multidimensional data set. For example, in a four-dimensional data set formed by the representative signal values I(Sx, Sy, Px, Py), local gradients of I with respect to any of the parameters Sx, Sy, Px, Py can be calculated. An optimization metric may be obtained by examining these gradients. For example, instead of using $1/3\sigma$ as a weighting factor, the reciprocal of the local gradient could be used.

Besides the pure statistical metrics for optimization, the optimization may also include knowledge of the inspection apparatus, such as a noise model of the camera, or the optical geometry.

Besides the optimization metric value, also a signal estimator value may be extracted for a given ROI box. Again multiple different implementations can be chosen. In statistical terms a representative signal value such as a measure of central tendency can be used as the signal estimator. A measure of central tendency is a central value or a typical value for a probability distribution. Examples of measure of central tendency include arithmetic mean, median, mode, geometric mean, harmonic mean, weighted mean, truncated mean, m and midrange.

In one embodiment, this estimator is the mean of the pixel values in the ROI box. In a more sophisticated embodiment the mean is combined with a filter, such as the 1σ and 2σ filters described above.

Finally, the principle of this method which is basically a transformation of the original image to another form as shown in FIGS. 10 (a) and (b), provides the opportunity to derive a new kind of measurement quality indicator called "Target Sigma". This parameter is conventionally calculated from the overlay numbers in each pixel inside the fixed ROI box of the known technique. In that case "Target sigma" is the 3σ variation of the overlay numbers inside the ROI box. It regularly has high values while machine performance is within specifications. An alternative definition of another measurement quality indicator based on the transformed data set illustrated in FIG. 10 (a) is expected to be more robust and to match better with the actual machine performance.

CONCLUSION

The methods described herein allow some or all of the issues identified in the introduction to be addressed in a practical implementation. Edge effects are effectively taken out because they only play a role for candidate ROI boxes close to the hard boundary. These candidates are limited in number and which have a relatively high variation measure (3σI). A high variation measure results in exclusion during intensity calculation, and/or a small weighting factor. Also the usage of a 1σ-filter for ROI boxes close to the edge (rather than using only a 2σ-filter for the entire ROI region) already improves the sensitivity to edge effects.

Since many combinations of ROI size's and positions are used, it is expected that oscillations are effectively averaged out. By using the disclosed method with many combinations of candidate ROI sizes and positions, the effect of intensity gradients inside the grating image is effectively minimized. A method of manufacturing devices using the lithographic process can be improved by providing an inspection apparatus as disclosed herein, using it to measure processed substrates to measure parameters of performance of the lithographic process, and adjusting parameters of the process to improve or maintain performance of the lithographic process for the processing of subsequent substrates.

It should be understood that the particular parameters used in the above examples are not the only ones that may be defined. Additional and/or alternative parameters can be used in a real design process, according to limitations of the lithographic apparatus and the inspection apparatus to be used for the metrology. While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

Figure 13:
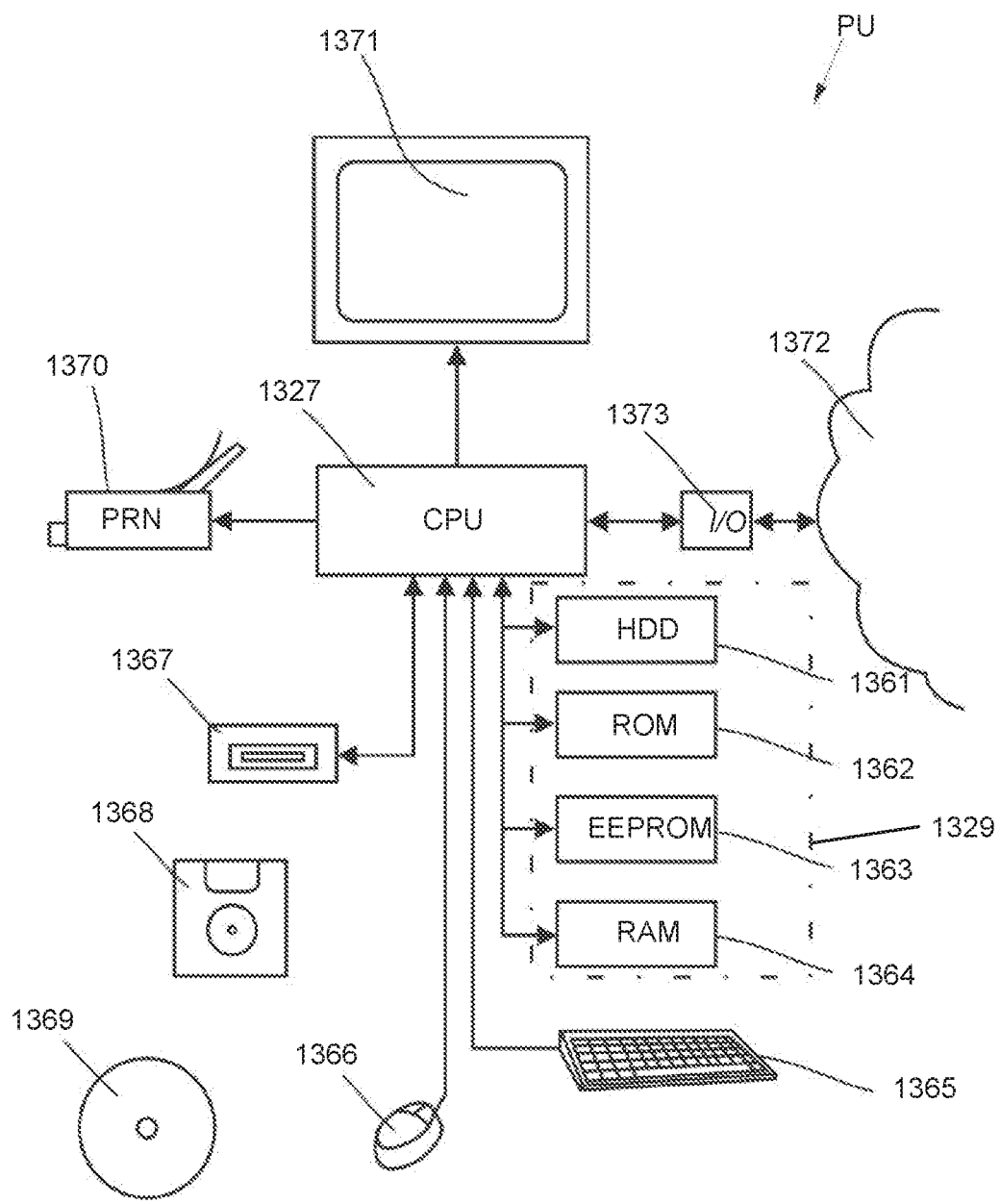
FIG. 13 illustrates schematically data processing hardware programmable to implement processors of embodiments of the invention.

The steps of the methods described above can be automated within any general purpose data processing hardware (computer). The apparatus may be integrated with existing processors, such as the processing unit PU shown in FIG. 3 (a), the lithography apparatus control unit LACU shown in FIG. 1 or an overall process control system. The hardware can be remote from the processing apparatus, even being located in a different country. Components of a suitable data processing apparatus (DPA) are shown in FIG. 13. The apparatus may be arranged for loading a computer program product comprising computer executable code. This may enable the computer assembly, when the computer program product is downloaded, to implement the functions of the inspection apparatus as described above.

Memory 1329 connected to processor 1327 may comprise a number of memory components like a hard disk 1361, Read Only Memory (ROM) 1362, Electrically Erasable Programmable Read Only Memory (EEPROM) 1363 en Random Access Memory (RAM) 1364. Not all aforementioned memory components need to be present. Furthermore, it is not essential that aforementioned memory components are physically in close proximity to the processor 1327 or to each other. They may be located at a distance away The processor 1327 may also be connected to some kind of user interface, for instance a keyboard 1365 or a mouse 1366. A touch screen, track ball, speech converter or other interfaces that are known to persons skilled in the art may also be used.

The processor 1327 may be connected to a reading unit 1367, which is arranged to read data, e.g. in the form of computer executable code, from and under some circumstances store data on a data carrier, like a floppy disc 1368 or a CDROM 1369. Also DVD's or other data carriers known to persons skilled in the art may be used.

The processor 1327 may also be connected to a printer 1370 to print out output data on paper as well as to a display 1371, for instance a monitor or LCD (Liquid Crystal Display), of any other type of display known to a person skilled in the art.

The processor 1327 may be connected to a communications network 1372, for instance a public switched telephone network (PSTN), a local area network (LAN), a wide area network (WAN) etc. by means of transmitters/receivers 1373 responsible for input/output (I/O). The processor 1327 may be arranged to communicate with other communication systems via the communications network 1372. In an embodiment of the invention external computers (not shown), for instance personal computers of operators, can log into the processor 1327 via the communications network 1372.

The processor 1327 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1327 may even be located a distance away of the other processing units and communicate via communications network 1372. Connections between modules can be made wired or wireless.

The computer system can be any signal processing system with analogue and/or digital and/or software technology arranged to perform the functions discussed here.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are provided in below numbered clauses:

1. A method of measuring a property of a target structure on a substrate, the method comprising the steps of:

(a) obtaining an image of the target structure using a predetermined portion of radiation diffracted by the target structure under illumination;

(b) defining a plurality of candidate regions of interest, each candidate region of interest comprising a plurality of pixels in said image;

(c) defining an optimization metric value for the candidate regions of interest based at least partly on signal values of pixels within the region of interest;

(d) defining directly or indirectly a target signal function which defines a contribution of each pixel in the image to a target signal value, the contribution of each pixel depending on (i) which candidate regions of interest contain that pixel and (ii) optimization metric values of those candidate regions of interest; and (e) obtaining a measurement of the property of the same target structure or a different target structure using a target signal value calculated directly or indirectly by combining multiple pixel signal values from a detected image in accordance with the defined target signal function.

2. A method according to clause 1, wherein the candidate regions of interest differ from one another in two or more parameters, the parameters defining which pixels of the image are contained within that candidate region of interest.

3. A method according to clause 2, wherein the parameters defining which pixels of the image are contained within each candidate region of interest define the candidate region of interest's position in said image.

4. A method according to clause 2 or clause 3, wherein the parameters defining which pixels of the image are contained within each candidate region of interest define the candidate region of interest's size in said image.

5. A method according to any preceding clause, wherein at least some regions of interest overlap each other so that a given pixel may be contained within more than one of the candidate regions of interest.

6. A method according to any preceding clause, wherein in step (e) the target signal value is calculated using at least one of a plurality of representative signal values, each representative signal value being a combination of pixel signal values of pixels contained within a respective one of the candidate regions of interest.

7. A method according to clause 6 wherein a plurality of representative signal values are combined with weightings dependent on the optimization metrics values for their respective candidate regions of interest.

8. A method according to clause 6 wherein the target signal value is calculated using a single representative signal value corresponding to a candidate region of interest having the best optimization metric value.

9. A method according to clause 6, 7 or 8 wherein pixel signal values of pixels contained within a candidate region of interest are filtered before calculating the representative value.

10. A method according to any of clauses 1 to 5, wherein in step (d) the target signal function is defined in the form of a contribution map in which a contribution of a given pixel to the target signal value is defined by a weighting value, and in step (e) pixel signal values from the detected image are combined in accordance with the their respective weighting values in the contribution map.

11. A method according to any preceding clause, wherein the optimization metric value is based on a measure of statistical dispersion of pixel signal values of pixels contained within the respective candidate region of interest.

12. A method according to clause 11, further comprising disregarding a candidate region of interest having excessive statistical dispersion of pixel signal values of pixels contained within the respective candidate region of interest.

13. A method according to any preceding clause, wherein the optimization metric value is based on a rate of change of a representative signal value relative to one or more parameters in a multi-dimensional space containing the set of candidate regions of interest, the representative signal value being determined from pixel signal values of pixels contained within the respective candidate region of interest.

14. A method according to clause 13, further comprising smoothing the representative signal value and/or two or more parameters, the parameters defining which pixels of the image are contained within that candidate region of interest, before calculating the optimization metric value.

15. A method according to any preceding clause, wherein step (b) comprises as a preliminary step identifying a bounded region in the obtained image, the bounded region corresponding to a specific target structure, wherein each candidate region of interest comprises a plurality of pixels within said bounded region.

16. A method according to any preceding clause, wherein the optimization metric value is calculated using a characteristic of apparatus used to form and detect the image.

17. A method according to any preceding clause, wherein pixel signal values of pixels contained within candidate regions of interest are filtered before calculating the optimization metric value.

18. An inspection apparatus for measuring a property of a target structure on a substrate, the apparatus comprising:
 a support for the substrate having said target structure formed thereon;
 an optical system for illuminating the target structure and obtaining an image of the target structure using a predetermined portion of radiation diffracted by the target structure;
 a processor arranged to:
  define a plurality of candidate regions of interest, each candidate region of interest comprising a plurality of pixels in said image;
  define an optimization metric value for the candidate regions of interest based at least partly on signal values of pixels within the region of interest;
  define directly or indirectly a target signal function which defines a contribution of each pixel in the image to a target signal value, the contribution of each pixel depending on (i) which candidate regions of interest contain that pixel and (ii) optimization metric values of those candidate regions of interest; and
  obtain a measurement of the property of the same target structure or a different target structure using a target signal value calculated directly or indirectly by combining multiple pixel signal values from a detected image in accordance with the defined target signal function.

19. An apparatus according to clause 18, wherein the candidate regions of interest differ from one another in two or more parameters, the parameters defining which pixels of the image are contained within that candidate region of interest.

20. An apparatus according to clause 19, wherein the parameters defining which pixels of the image are contained within each candidate region of interest define the candidate region of interest's position in said image.

21. An apparatus according to clause 19 or clause 20, wherein the parameters defining which pixels of the image are contained within each candidate region of interest define the candidate region of interest's size in said image.

22. An apparatus according to any of clauses 18 to 21, wherein at least some regions of interest overlap each other so that a given pixel may be contained within more than one of the candidate regions of interest.

23. An apparatus according to any of clauses 18 to 22, wherein the processor is arranged to calculate the target signal value using at least one of a plurality of representative signal values, each representative signal value being a combination of pixel signal values of pixels contained within a respective one of the candidate regions of interest.

24. An apparatus according to clause 23 wherein the processor is arranged to combine a plurality of representative signal values with weightings dependent on the optimization metrics values for their respective candidate regions of interest.

25. An apparatus according to clause 23 wherein the processor is arranged to calculate the target signal value using a single representative signal value corresponding to a candidate region of interest having the best optimization metric value.

26. An apparatus according to clause 23, 24 or 25 wherein the processor is arranged to filter pixel signal values of pixels contained within a candidate region of interest before calculating the representative value.

27 An apparatus according to any of clauses 18 to 22, wherein the processor is arranged to define the target signal function in the form of a contribution map in which a contribution of a given pixel to the target signal value is defined by a weighting value, and in step (e) pixel signal values from the detected image are combined in accordance with the their respective weighting values in the contribution map.

28. An apparatus according to any of clauses 18 to 27, wherein the processor is arranged to base the optimization metric value on a measure of statistical dispersion of pixel signal values of pixels contained within the respective candidate region of interest.

29. An apparatus according to clause 28, further comprising disregarding a candidate region of interest having excessive statistical dispersion of pixel signal values of pixels contained within the respective candidate region of interest.

30. An apparatus according to any of clauses 18 to 29, wherein the processor is arranged to base the optimization metric value on a rate of change of a representative signal value relative to one or more parameters in a multi-dimensional space containing the set of candidate regions of interest, and wherein processor is arranged to determine the representative signal value from pixel signal values of pixels contained within the respective candidate region of interest.

31. An apparatus according to clause 30, the processor is arranged to smooth the representative signal value and/or two or more parameters, the parameters defining which pixels of the image are contained within that candidate region of interest, before calculating the optimization metric value.

32. An apparatus according to any of clauses 18 to 31, wherein the processor is arranged to identify, as a preliminary step to defining a plurality of candidate regions of interest, a bounded region in the obtained image, the bounded region corresponding to a specific target structure, wherein each candidate region of interest comprises a plurality of pixels within said bounded region.

33. An apparatus according to any of clauses 18 to 32, wherein the processor is arranged to calculate the optimization metric value using a characteristic of apparatus used to form and detect the image.

34. An apparatus according to any of clauses 18 to 33, wherein the processor is arranged to filter pixel signal values of pixels contained within candidate regions of interest before calculating the optimization metric value.

35. A computer program product comprising machine-readable instructions for causing a general purpose processing apparatus to perform the steps (b) to (e) of a method according to any of clauses 1 to 17 above.

36. A lithographic system comprising:
a lithographic apparatus comprising:
an illumination optical system arranged to illuminate a pattern;
a projection optical system arranged to project an image of the pattern onto a substrate; and
an inspection apparatus according to any of clauses 18 to 34,
wherein the lithographic apparatus is arranged to use the measurement results from the inspection apparatus in applying the pattern to further substrates.

37. A method of manufacturing devices wherein a device pattern is applied to a series of substrates using a lithographic process, the method including inspecting at least one target structure formed as part of or beside said device pattern on at least one of said substrates using a method according to any of clauses 1 to 17 and controlling the lithographic process for later substrates in accordance with the result of the method.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a property of a target structure on a substrate, the method comprising:
obtaining an image of the target structure using a predetermined portion of radiation diffracted by the target structure under illumination;
defining candidate regions of interest each comprising a plurality of pixels in the obtained image, wherein the candidate regions of interest's differ from one another in two or more parameters, the two or more parameters defining (i) which pixels of the obtained image are contained within that respective one of the candidate regions of interest and (ii) the respective ones of the candidate regions of interest position in the obtained image;
defining an optimization metric value for the candidate regions of interest based at least partly on pixel signal values of the plurality of pixels within each of the candidate regions of interest;
defining a target signal function which defines a contribution of each pixel in the obtained image to a target signal value, the contribution of each pixel depending on (i) which respective ones of the candidate regions of interest contain that pixel and (ii) optimization metric values of the respective ones of the candidate regions of interest;
obtaining a measurement of the property of the target structure or a different target structure using the target signal value determined by combining multiple pixel signal values from the obtained image in accordance with the defined target signal function; and
storing the measurement in a memory such that adjustments to exposure of subsequent substrates or reworking of the substrate with the target structure can be done using the measurement to improve yield.

2. The method of claim 1, wherein the two or more parameters define the candidate regions of interest's size in the obtained image.

3. The method of claim 1, wherein a plurality of representative signal values are combined with weightings dependent on the optimization metrics values for their respective ones of the candidate regions of interest.

4. The method of claim 1, wherein the target signal value is calculated using a single representative signal value corresponding to a candidate region of interest of the candidate regions of interest having a best optimization metric value.

5. The method of claim 1, wherein the pixel signal values of the plurality of pixels contained within the candidate regions of interest are filtered before calculating a representative value.

6. The method of claim 1, further comprising disregarding a candidate region of interest of the candidate regions of interest having excessive statistical dispersion of pixel signal values of pixels contained within the respective ones of the candidate regions of interest.

7. The method of claim 1, further comprising smoothing a representative signal value of two or more parameters, the two or more parameters defining which pixels of the obtained image are contained within the respective ones of the candidate regions of interest, before calculating the optimization metric value.

8. The method of claim 1, wherein the optimization metric value is calculated using a characteristic of the apparatus used to form and detect the obtained image of the target structure.

9. The method of claim 1, wherein the pixel signal values of the plurality of pixels contained within the respective ones of the candidate regions of interest are filtered before calculating the optimization metric value.

10. An apparatus for measuring a property of a target structure on a substrate, the apparatus comprising:
a support configured to support the substrate having the target structure formed thereon;
an optical system configured to illuminate the target structure and obtain an image of the target structure using a predetermined portion of radiation diffracted by the target structure;
a processor arranged to:
define candidate regions of interest each comprising a plurality of pixels in the obtained image, wherein the candidate regions of interest differ from one another in two or more parameters, the two or more parameters defining (i) which pixels of the obtained image are contained within that respective one of the candidate regions of interest and (ii) the respective ones of the candidate regions of interest's position in the obtained image;
define an optimization metric value for respective ones of the candidate regions of interest based at least partly on pixel signal values of the plurality of pixels within the respective ones of the candidate regions of interest;
define a target signal function which defines a contribution of each pixel in the obtained image to a target signal value, the contribution of each pixel depending on (i) which respective ones of the candidate regions of interest contain that pixel and (ii) optimization metric values of the respective ones of the candidate regions of interest;
obtain a measurement of the property of the target structure or a different target structure using the target signal value determined by combining multiple pixel signal values from the obtained image in accordance with the defined target signal function; and
storing the measurement in a memory such that adjustments to exposure of subsequent substrates or reworking of the substrate with the target structure can be done using the measurement to improve yield.

11. The apparatus of claim 10, wherein the processor is arranged to combine a plurality of representative signal values with weightings dependent on the optimization metric values for the respective ones of the candidate regions of interest.

12. The apparatus of claim 10, wherein the processor is arranged to calculate the target signal value using a single representative signal value corresponding to a candidate region of interest of the candidate regions of interest having a best optimization metric value.

13. The apparatus of claim 10, wherein the processor is arranged to filter the pixel signal values of the plurality of pixels contained within the respective ones of the candidate regions of interest before calculating the representative value.

14. The apparatus of claim 10, further comprising disregarding a candidate region of interest of the candidate regions of interest having excessive statistical dispersion of pixel signal values of the plurality of pixels contained within the respective ones of the candidate regions of interest.

15. The apparatus of claim 10, wherein the processor is arranged to smooth the representative signal value and/or two or more parameters, the parameters defining which pixels of the obtained image are contained within the respective ones of the candidate regions of interest, before calculating the optimization metric value.

16. The apparatus of claim 10, wherein the processor is arranged to calculate the optimization metric value using a characteristic of the apparatus used to form and detect the obtained image.

17. The apparatus of claim 10, wherein the processor is arranged to filter pixel signal values of pixels contained within the respective ones of the candidate regions of interest before calculating the optimization metric value.

18. A non-transitory computer-readable storage device having instructions stored thereon, execution of which, by a computing device, cause the computing device to perform operations comprising:
obtaining an image of the target structure on a substrate using a predetermined portion of radiation diffracted by the target structure under illumination;
defining candidate regions of interest each comprising a plurality of pixels in the obtained image, wherein the candidate regions of interest differ from one another in two or more parameters, the two or more parameters defining (i) which pixels of the obtained image are contained within that respective one of the candidate regions of interest and (ii) the respective ones of the candidate regions of interest's position in the obtained image;
defining an optimization metric value for the candidate region of interest based at least partly on pixel signal values of the plurality of pixels within each of the candidate region of interest;
defining a target signal function which defines a contribution of each pixel in the obtained image to a target signal value, the contribution of each pixel depending on (i) which respective ones of the candidate regions of interest contain that pixel and (ii) optimization metric values of the respective ones of the candidate regions of interest;
obtaining a measurement of the property of the target structure or a different target structure using the target signal value calculated by combining multiple pixel signal values from the obtained image in accordance with the defined target signal function; and
storing the measurement in a memory such that adjustments to exposure of subsequent substrates or reworking of the substrate with the target structure can be done using the measurement to improve yield.

* * * * *